US012713950B2

(12) United States Patent
Ecton et al.

(10) Patent No.: US 12,713,950 B2
(45) Date of Patent: Aug. 18, 2026

(54) THREE-DIMENSIONAL INTEGRATION OF DIES IN AN INTEGRATED CIRCUIT DEVICE

(71) Applicant: Intel Corporation, Santa Clara, CA (US)

(72) Inventors: Jeremy D. Ecton, Gilbert, AZ (US); Brandon Christian Marin, Gilbert, AZ (US); Srinivas V. Pietambaram, Chandler, AZ (US); Gang Duan, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 17/939,824

(22) Filed: Sep. 7, 2022

(65) Prior Publication Data

US 2024/0079335 A1 Mar. 7, 2024

(51) Int. Cl.

| | |
|---|---|
| ***H10W 70/65*** | (2026.01) |
| ***H10W 70/60*** | (2026.01) |
| ***H10W 70/685*** | (2026.01) |
| ***H10W 74/10*** | (2026.01) |
| ***H10W 90/00*** | (2026.01) |

(52) U.S. Cl.

CPC .......... *H10W 70/65* (2026.01); *H10W 70/611* (2026.01); *H10W 70/685* (2026.01); *H10W 74/117* (2026.01); *H10W 90/00* (2026.01); *H10W 90/794* (2026.01)

(58) Field of Classification Search

CPC ............. H10W 70/611; H10W 70/618; H10W 70/65; H10W 70/685; H10W 72/823; H10W 72/90; H10W 74/117; H10W 90/00; H10W 90/20; H10W 90/291; H10W 90/401; H10W 90/701; H10W 90/794; H10W 99/00; H10P 72/74; H10P 72/7424

See application file for complete search history.

(56) References Cited

U.S. PATENT DOCUMENTS 11,694,940 B1 * 7/2023 Mathuriya ............ G11C 11/005 257/295
12,272,672 B2 * 4/2025 Chou .................. H01L 21/6835
2020/0035591 A1 * 1/2020 Hu .................... H01L 23/49838
2020/0066643 A1 * 2/2020 Yu ........................... H01L 24/20

(Continued)

OTHER PUBLICATIONS

"Innolink—The Advanced Chiplet Solution Complies with the Universal Chiplet Interconnect Express (UCIe) Standard." Design And Reuse, Jul. 7, 2022, https://www.design-reuse.com/news/52299/innosilicon-innolink-ucie-standard.html., 11 pages.

(Continued)

*Primary Examiner* — Dao H Nguyen
(74) *Attorney, Agent, or Firm* — Alliance IP, LLC

(57) ABSTRACT

In one embodiment, an integrated circuit device includes a first layer having input/output (IO) hub circuitry to interconnect a plurality of integrated circuit dies, and a second layer having a plurality of integrated circuit dies electrically connected to the IO hub circuitry. The first layer may include glass, and the IO hub circuitry may be in a die embedded within the first layer. The integrated circuit dies may be electrically connected to the IO hub circuitry through an interposer.

20 Claims, 11 Drawing Sheets

(56) References Cited

U.S. PATENT DOCUMENTS

| | | | | |
|---|---|---|---|---|
| 2021/0193637 | A1* | 6/2021 | Jeng | H01L 23/5384 |
| 2021/0225809 | A1* | 7/2021 | Yu | H10N 50/01 |
| 2021/0335726 | A1* | 10/2021 | Wu | H01L 21/4853 |
| 2022/0157732 | A1* | 5/2022 | Tsai | H01L 21/4857 |
| 2023/0137691 | A1* | 5/2023 | Lai | H01L 23/145<br>257/701 |

OTHER PUBLICATIONS

Shirasaka, Toshiaki, et al. "Comprehensive Study on Advanced Chip on Wafer Hybrid Bonding with Copper/Polyimide Systems." 2022 IEEE 72nd Electronic Components and Technology Conference (ECTC), Jun. 2022, pp. 317-323. IEEE Xplore, https://doi.org/10.1109/ECTC51906.2022.00059., 7 pages.

* cited by examiner

Top view

Side view

Die 108D

Die 108B

Die 108C

Die 108A

Hub 106

110

102

Die 108B

Die 108A

IO Hub 106

105

110

104

103

Substrate 102

Main board 101

Top view

Die 309I
Die 309J
Die 309K
Die 309L
Interposer 308C
Interposer 308D
Die 309M
Die 309N
Die 309O
Die 309P
Hub 306
Die 309A
Die 309B
Die 309C
Die 309D
Interposer 308A
Interposer 308B
Die 309E
Die 309F
Die 309G
Die 309H
310
302

Side view

Die 309A
Die 309B
Die 309C
Die 309D
Interposer 308A
Interposer 308B
IO Hub 306
310
304
303
Substrate 302
Main board 301

Top view

Die 409I
Die 409J
Die 409M
Die 409N
Interposer 408C
Die 409K
Die 409L
Die 409O
Die 409P
Interposer 408D
Hub 406
Die 409A
Die 409B
Die 409E
Die 409F
Interposer 408A
Die 409C
Die 409D
Die 409G
Die 409H
Interposer 408B
410
402

Side view

Die 409A
Die 409B
Interposer 408A
Die 409C
Die 409D
Interposer 408B
IO Hub circuitry 406
410
404
403
Substrate 402
Main board 401

500

503 503 503 503

504

Cavity 505

Carrier substrate 502

Fill pillars

Place Hub circuitry in cavity

Add/grind mold around hub

Attach die (and interposer) / remove carrier

To Fig. 5B

THREE-DIMENSIONAL INTEGRATION OF DIES IN AN INTEGRATED CIRCUIT DEVICE

BACKGROUND

The demand for the miniaturization of form factors and increased levels of integration for high performance are driving sophisticated packaging approaches in the semiconductor industry. One approach that has recently been introduced in the use of an IO hub to facilitate communication between dies of a multi-die integrated circuit package. In current designs, the IO hub may be embedded within the package substrate and may utilize routing within the package substrate (e.g., redistribution layers) to facilitate the die-to-die communications.

DETAILED DESCRIPTION

Embodiments herein incorporate an IO hub within an integrated circuit chip to interconnect multiple dies of the chip. Such an architecture can enable die partitioning, which can enable smaller form factors and higher performance without yield issues seen with other methods. However, die partitioning typically needs fine die-to-die interconnections, and current technologies utilize passive bridges (e.g., Intel® embedded multi-die interconnect bridges (EMIBs)) that are embedded within a package substrate.

Embedded bridges can enable very high density die-to-die connections only where needed and allow for standard flip-chip assembly to be used for robust power delivery and for connecting high-speed signals directly from the die to the package substrate. For future generations of die partitioning, several bridges are needed that can connect the dies at much finer bump pitches (e.g., 25 microns or lower). However, the embedded bridge approach can suffer from a high cumulative Bump Thickness Variation (BTV) and as the number of bridges to be embedded increase, and thus, the cost of embedding and yields can suffer.

Alternate architectures and/or approaches such as active silicon interposers and interconnect dies have been proposed. The interconnect dies may involve an embedded bridge that includes through-silicon via (TSV) connections or an active functional die, instead of a passive bridge with no TSV connections. Fine die-to-die interconnections for die tiling can be accomplished through this embedded die.

Another approach that has recently garnered interest is the use of an input/output (IO) hub embedded within the package substrate. However, this may require routing within the package substrate, e.g., redistribution layers, for the die-to-IO hub communications. This can limit the signal transmission efficiency and can pose limitations with respect to valuable real estate within the package substrate.

Accordingly, embodiments herein may implement an IO hub that is embedded within a layer (e.g., a glass layer) of a multi-die integrated circuit package, which may enable three dimensional (3D) heterogenous integration of a centralized IO Hub to multiple dies with multiple lines of communication. Embodiments herein can accordingly enable direct IO Hub to die communication, multiple direct communication access points (e.g., 4 or more), and improved power delivery (e.g., with solderless die to die interconnects and direct connections between dies). Additionally, embodiments herein may embed the IO hub within a glass layer of the package, which provides a low total thickness variation (TTV) medium with good dimensional stability, as it has a low coefficient of thermal efficiency (CTE). Certain embodiments may also utilize a laser-based process for patterning of glass layers to form interconnects between the die on a top layer and the package substrate.

Figure 1:
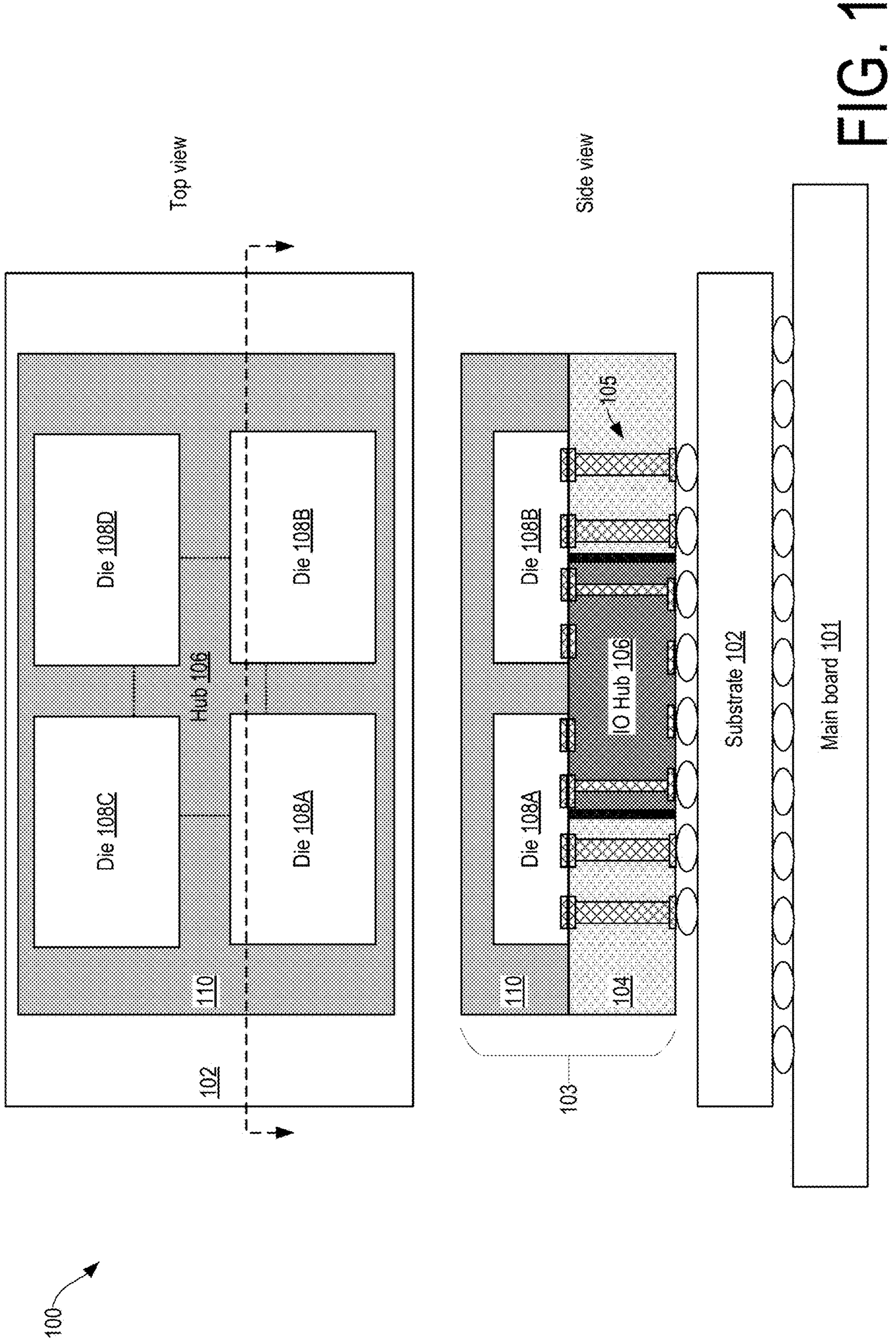
FIG. 1 illustrates an example system with an IO hub embedded inside an integrated circuit chip.

FIG. 1 illustrates an example system 100 with an IO hub 106 embedded inside an integrated circuit chip 103 in accordance with embodiments herein. The system 100 includes a main circuit board 101 (e.g., a motherboard or system board) of a computer system in some embodiments, or as a base circuit board of a peripheral device (e.g., a graphics card, non-volatile memory PCIe device, etc.) that is to be connected to another circuit board (e.g., a motherboard of a computer system). The example system 100 also includes a package substrate 102 to which the integrated circuit chip 103 is attached. The package substrate 102 provides electrical connections between the chip 103 (and components thereof) and the main circuit board 101. The package substrate 104 may also include passive circuit components, and in some embodiments, active circuit components as well.

The integrated circuit chip 103 includes four integrated circuit dies 108 that are interconnected with one another via an input/output (IO) hub 106 (which is a die having IO hub circuitry therein) that is embedded in the chip 103. In the example shown, each die 108 is connected to the IO hub 106 at a particular top corner of the IO hub 106 (as shown by the top view). Although four dies 108 are shown, any suitable number of dies may be included and connected to the IO hub 106, e.g., 2 dies, 6 dies, 10 dies, etc. The IO hub 106 is embedded within a first chip layer 104, which may be glass (e.g., $SiO_2$) or silicon (Si) in certain embodiments. For example, the IO hub 106 may be a separately fabricated component that is placed/embedded into a cavity of the layer 104, e.g., as described below with respect to FIGS. 5A-5B.

The dies 108 are within a second layer 110 of the chip 103 that is on the first layer 104. The second layer material may be a mold material for encapsulating the dies 108 after they are attached to the IO hub 106. Each die 108 is electrically coupled with the IO hub 106 via a hybrid bonding technique in the example shown. In particular, each die 108 has hybrid bonding pads on a bottom side of the die that are connected to respective hybrid bonding pads on a top side of the IO hub 106. The hybrid bonding technique may create a direct connection between the boding pads of the dies 108 and the bonding pads of the IO hub 106. Other embodiments may utilize traditional solder bonding techniques between the dies 108 and IO hub 106. In addition, the dies 108A, 108B are coupled to the package substrate 102 directly through metal pillars 105 within the first layer 104.

The IO hub 106 includes circuitry for interconnecting the dies 108. For instance, the IO hub circuitry may implement a die-to-die communication fabric that directly connects each of the dies 108 to one another, e.g., in a similar manner as if the dies 108 were fabricated together in a monolithic (e.g., single die/chip) design. The IO hub circuitry may include passive and/or active circuitry, and in some embodiments, may include TSVs in addition to (or in lieu of) the pillars shown in FIG. 1 to connect the dies 108 to the package substrate 102, e.g., for power delivery or other needs. In certain embodiments, the IO hub 106 may implement an interconnect that is compatible with a Universal Chiplet Interconnect Express (UCIe) standard.

Each die 108 may include one or more computing system components, such as one or more processor units (e.g., system-on-a-chip (SoC), processor core, graphics processor unit (GPU), accelerator, chipset processor), 110 controller, memory, or network interface controller. In some embodiments, the dies 108 can include one or more additional active or passive devices such as capacitors, decoupling capacitors, resistors, inductors, fuses, diodes, transformers, sensors, electrostatic discharge (ESD) devices, and memory devices. In addition to comprising one or more processor units, the dies 108 can include additional components, such as embedded DRAM, stacked high bandwidth memory (HBM), shared cache memories, input/output (I/O) controllers, or memory controllers.

Figure 2:
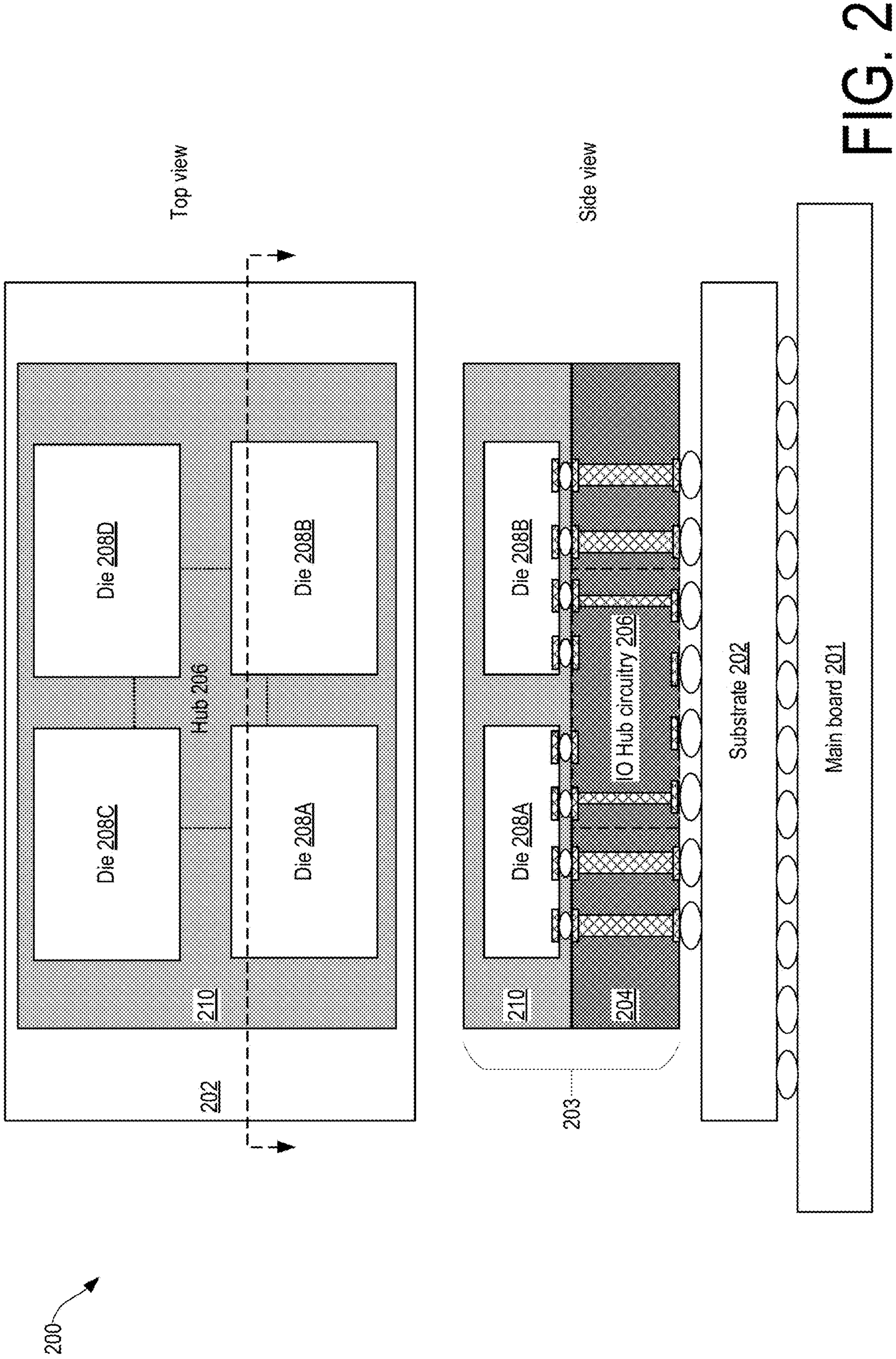
FIG. 2 illustrates an example system with IO hub circuitry embedded inside an integrated circuit chip in accordance with embodiments herein.

FIG. 2 illustrates an example system 200 with IO hub circuitry 206 embedded inside an integrated circuit chip 203 in accordance with embodiments herein. The example system 200 generally includes the same or similar components as described above with respect to the system 100. In particular, the main circuit board 201 may be implemented in the same or similar manner as the main circuit board 101, the package substrate 202 may be implemented in the same or similar manner as the package substrate 102, the dies 208 may be implemented in the same or similar manner as the dies 108. However, in contrast to the system 100, the system 200 includes IO hub circuitry 206 that is fabricated or otherwise formed within the layer 204, as opposed to being a separate component that is embedded within a cavity of the layer. In addition, in the example shown, the dies 208 are connected to the IO hub 206 and the pillars of the layer 204 through a traditional solder bond technique. Similar to the example system 100, the material of the layer 210 may be a mold material that encapsulates the dies 208 after they are attached to the IO hub circuitry 206 within the layer 204.

Figure 3:
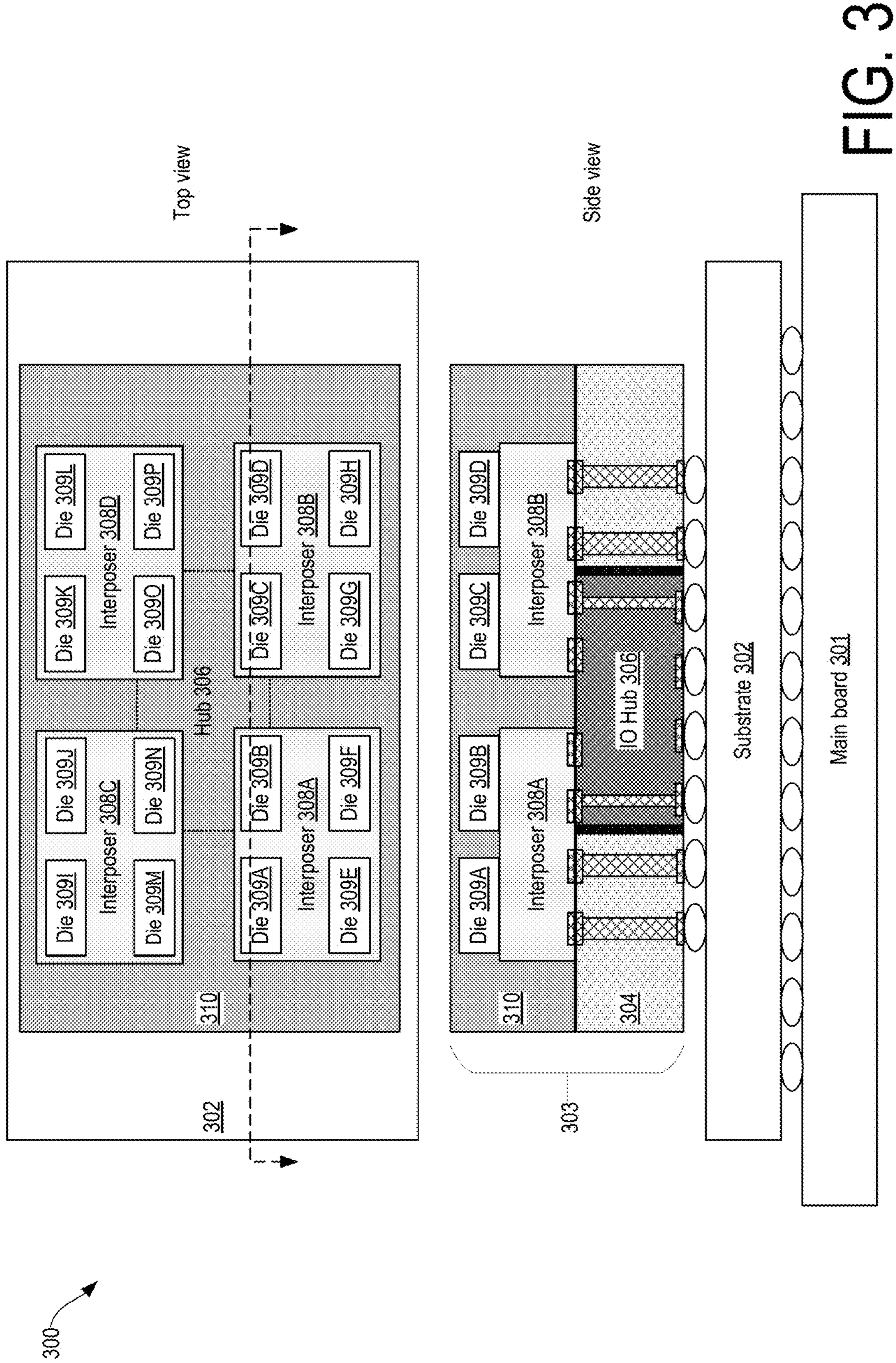
FIG. 3 illustrates another example system with an IO hub embedded inside an integrated circuit chip in accordance with embodiments herein.

FIG. 3 illustrates another example system 300 with an IO hub 306 embedded inside an integrated circuit chip 303 in accordance with embodiments herein. The system 300 includes a main circuit board 301, which may be similar to the main circuit board 101 of FIG. 1 and 201 of FIG. 2, and a package substrate 302 to which the integrated circuit chip 303 is attached. The package substrate 302 may be implemented similar to the package substrate 102 of FIG. 1 and 202 of FIG. 2.

The integrated circuit chip 303 includes four interposers 308, with four dies 308 connected to each respective interposer. The interposers 308 are interconnected with one another via an input/output (IO) hub 306 that is embedded in the chip 303. In the example shown, each interposer 308 is connected to the IO hub 306 at a particular top corner of the IO hub 306, and each die 309 is connected to its respective interposer 308 at a particular top corner of the interposer 308 (as shown by the top view). Although four interposers 308 are shown with four dies 309 connected to each interposer 308, any suitable number of interposers with any suitable number of connected dies may be included in the chip 303 and may be connected to the IO hub 306. In certain embodiments, each interposer may have a different number of dies connected thereto. The IO hub 306 is embedded within a first chip layer 304, which may be glass or silicon in certain embodiments. For example, the IO hub 306 may be a separately fabricated component that is placed/embedded into a cavity of the layer 304, e.g., as described below with respect to FIGS. 5A-5B. The interposers 308 and dies 309 are in a second layer 310, which may include a mold material that is formed around the interposers 308 and dies 309.

Each interposer 308 may include passive and/or active circuitry to connect its dies 309 to each other and/or to the IO hub 306. In certain embodiments, for example, an interposer 308 may include active logic circuitry that communicably couples the dies 309 attached to the interposer 308 as well as to the IO hub 306, for communication with other dies 309 of the chip 303. In certain embodiments, each interposer 308 may connect to its dies 309 via a hybrid bonding interface, similar to the connections between the interposers 308 and the IO hub 306.

Each die 309 may include one or more computing system components, such as one or more processor units (e.g., system-on-a-chip (SoC), processor core, graphics processor unit (GPU), accelerator, chipset processor), I/O controller, memory, or network interface controller. In some embodiments, the dies 309 can include one or more additional active or passive devices such as capacitors, decoupling capacitors, resistors, inductors, fuses, diodes, transformers, sensors, electrostatic discharge (ESD) devices, and memory devices. In addition to comprising one or more processor units, the dies 309 can include additional components, such as embedded DRAM, stacked high bandwidth memory (HBM), shared cache memories, input/output (I/O) controllers, or memory controllers. In certain instances, the dies 309 may be referred to as "chiplets", and each die 309 may implement a separate function, e.g., one die implements processor circuitry while another implements memory circuitry.

Figure 4:
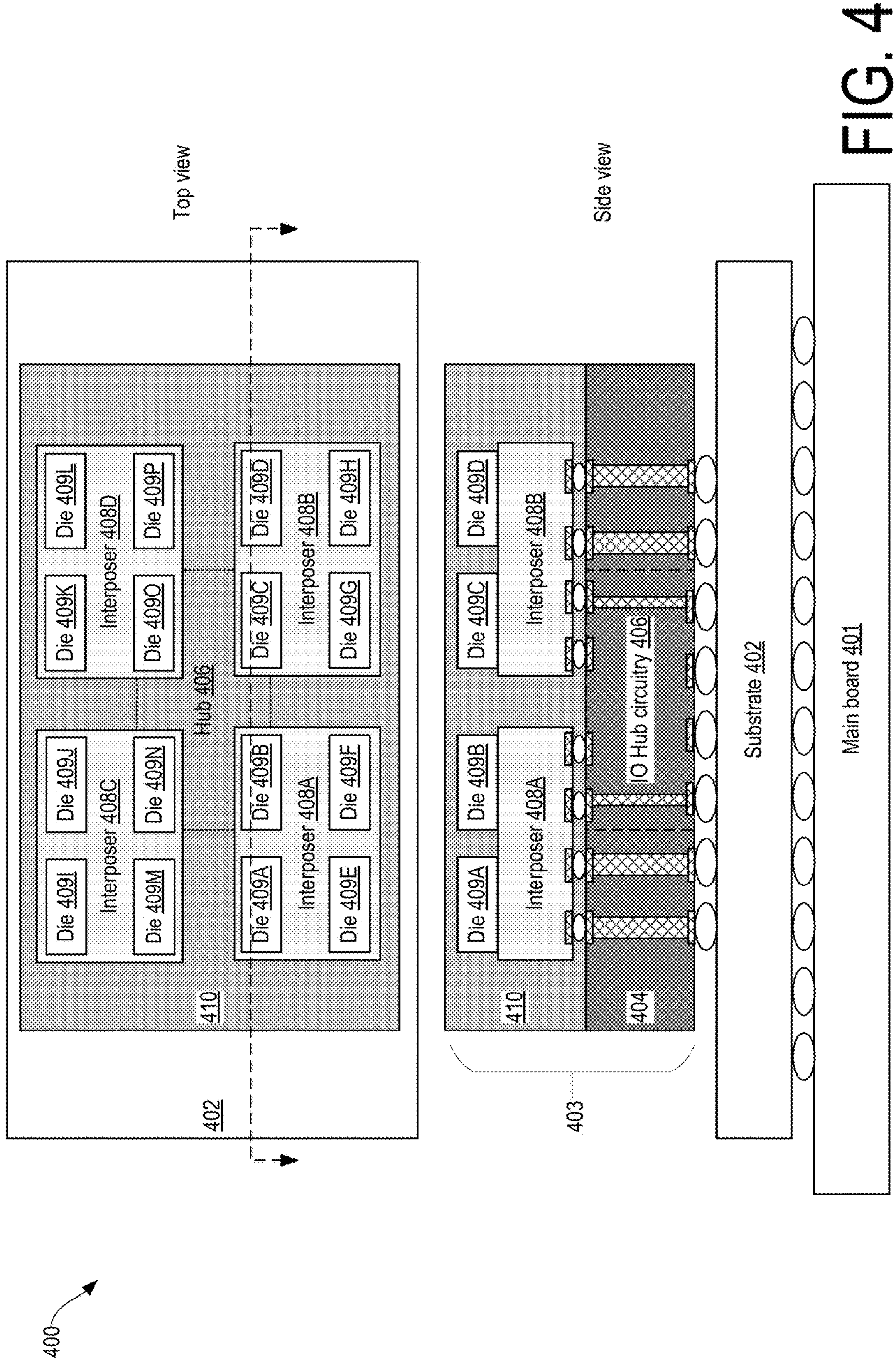
FIG. 4 illustrates another example system with IO hub circuitry embedded inside an integrated circuit chip in accordance with embodiments herein.

FIG. 4 illustrates another example system 400 with IO hub circuitry 406 embedded inside an integrated circuit chip 403 in accordance with embodiments herein. The example system 400 generally includes the same or similar components as described above with respect to the system 300. In particular, the main circuit board 401 may be implemented in the same or similar manner as the main circuit board 301, the package substrate 402 may be implemented in the same or similar manner as the package substrate 302, the dies 408 may be implemented in the same or similar manner as the dies 308. However, in contrast to the system 300, the system 400 includes IO hub circuitry 406 that is fabricated or otherwise formed within the layer 404, as opposed to being a separate component that is embedded within a cavity of the layer 404. Additionally, in contrast to the system 300, in the example system 400, the dies 408 are connected to the IO hub 406 and the pillars of the layer 404 through a traditional solder bond technique instead of a hybrid bonding technique. The material of the layer 410 may be a mold material that encapsulates the dies 408 after they are attached to the IO hub circuitry 406 within the layer 404.

Figure 5A:
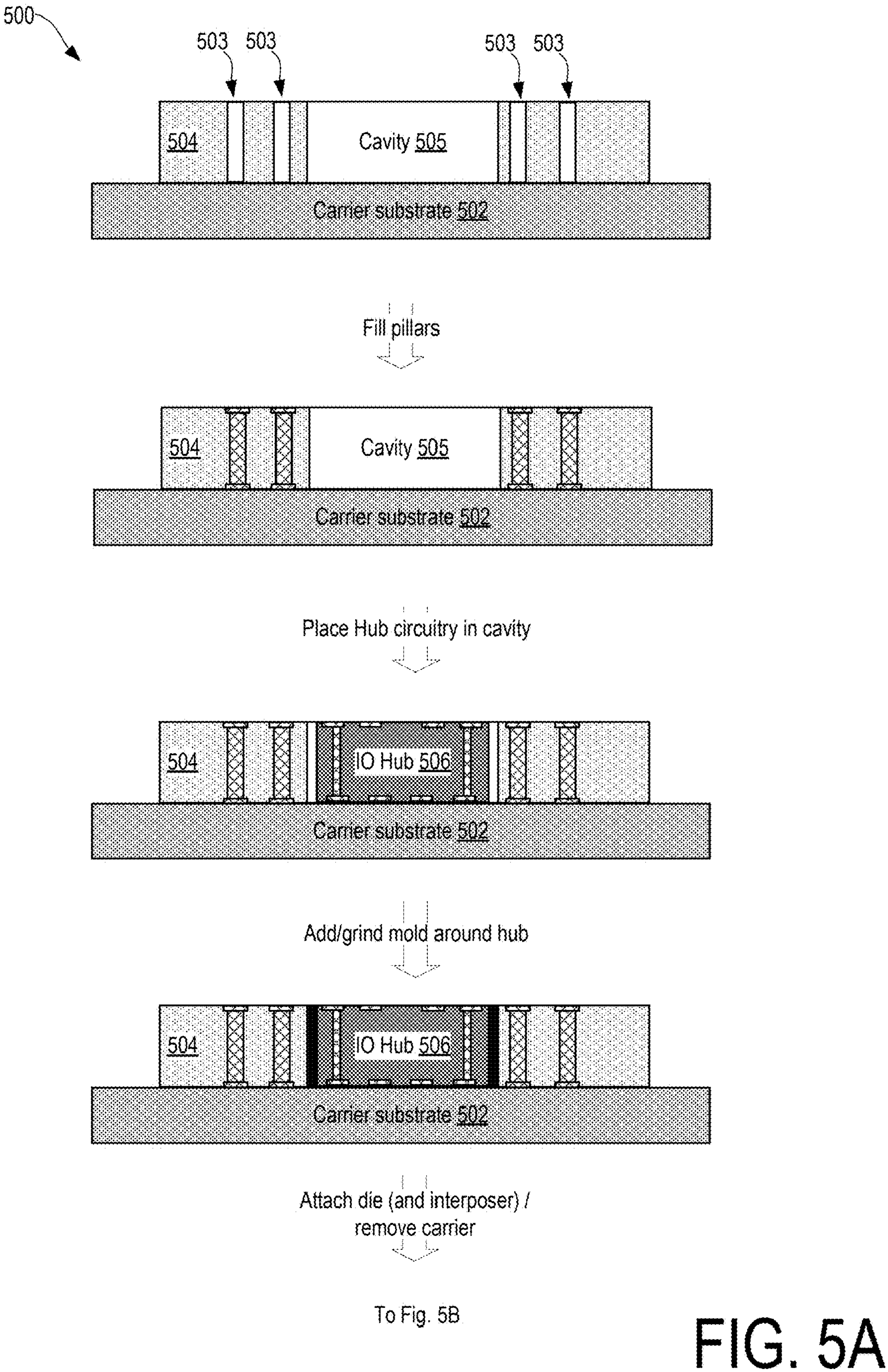
FIGS. 5A-5B illustrate an example process for manufacturing an integrated circuit package in accordance with embodiments herein.
Figure 5B:
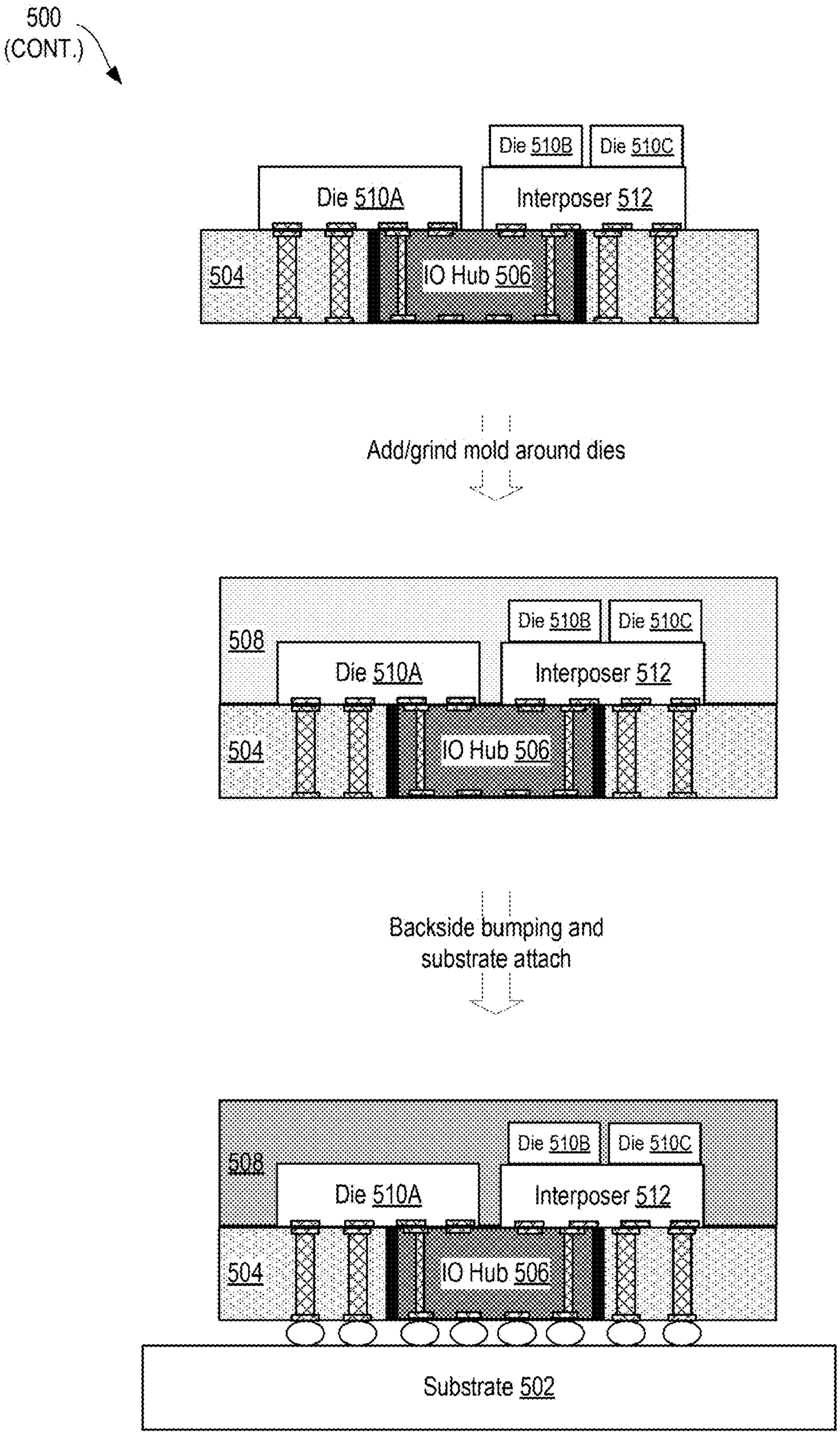

FIGS. 5A-5B illustrate an example process 500 for manufacturing an integrated circuit package in accordance with embodiments herein. The example process shown may include additional, fewer, or different operations or aspects than those shown or described below. In some embodiments, one or more of the operations shown in FIGS. 5A-5B include multiple operations, sub-operations, etc. The illustrations of FIGS. 5A-5B may thus represent different stages in the manufacturing process.

The example process begins with the patterning of a first layer 504 of an integrated circuit chip (e.g., 103, 203, 303, 403). In certain embodiments the layer 504 may be a glass layer, while other embodiment may implement a silicon or silicon-based layer, while still other embodiments may implement another suitable type of layer in which an IO hub or other type of die can be embedded as described herein. The layer 504 is placed on a carrier substrate 502, which can be any suitable substrate material. Holes 503 and a cavity 505 may be laser patterned, drilled, or otherwise formed in the layer 504 as shown. The holes 503 are then filled with metal or another type of conductor to form vias as shown, and an IO hub 506 is placed within the cavity 505 as shown. A mold material is added to fill in the space still remaining in the cavity 505 around the IO hub 506, and the mold material is ground down to expose the metal connectors on the top side as shown.

Then, multiple dies 510 can be connected to the IO hub 506 and the carrier substrate 502 can be removed. The carrier substrate 502 can be removed before or after the dies 510 are attached. In the example shown, the die 510A is connected directly to the top side of the IO hub 506, while dies 510B, 510C are connected indirectly to the IO hub 506 via an interposer 512. The interposer 512 may include passive and/or active circuitry, and may be implemented in the same or similar manner as the interposers 308, 408 as described above. In the example shown, the die 510A and the interposer 512 are connected to the IO hub 506 by a hybrid bonding technique, e.g., a polyimide-based hybrid bonding technique or a silicon oxide-based hybrid bonding technique. However, other embodiments may connect the die 510A and the interposer 512 to the IO hub 506 through a solder bonding technique. A mold material 508 is then deposited around the dies 510 and the interposer 512. Then, backside solder bumping is performed on the bottom side of the chip, e.g., on the bottom side of the IO hub 506 and bottom side of the vias formed within the layer 504, and the chip may then be attached to a package substrate, which may be implemented in the same or similar manner as package substrates 102, 202, 302, 402. In other embodiments, the chip may be connected to the package substrate via a hybrid bonding technique.

Figure 6:
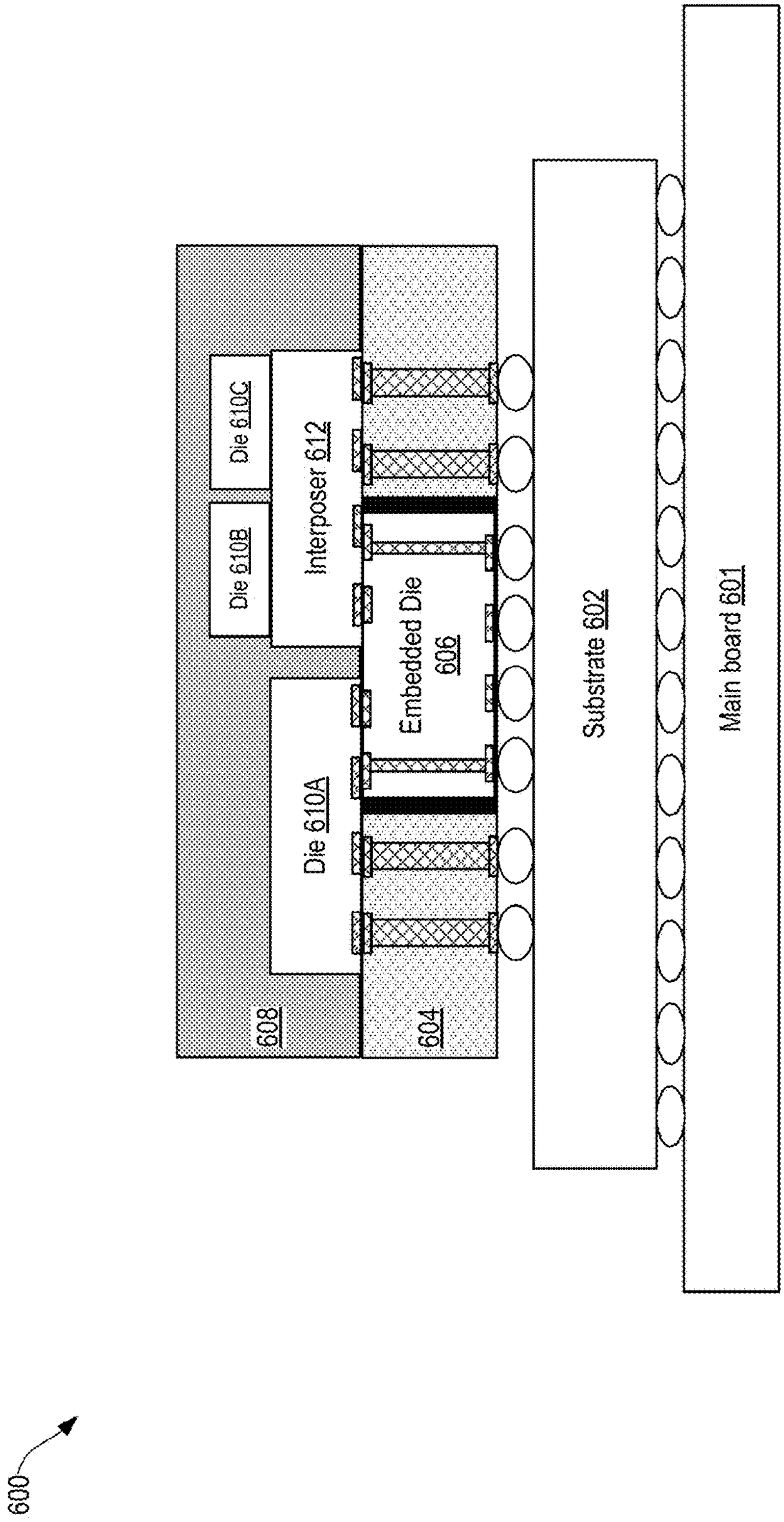
FIG. 6 illustrates an example system with a three-dimensional integration of dies within an integrated circuit chip in accordance with embodiments herein.

FIG. 6 illustrates an example system 600 with a three-dimensional integration of dies within an integrated circuit chip in accordance with embodiments herein. The example system 600 is similar to the examples of FIGS. 1-4, e.g., it includes a 3D stacked configuration of multiple dies (606, 610) but includes an embedded die 606 within the first layer 604 that may be something other than an IO hub as described above. For example, the embedded die 606 may be a memory die, a processor die, or another type of integrated circuit die. The example system 600 includes a first die 610A directly connected to the embedded die 606 and an interposer 612 connected to the embedded die 606, with two dies 610B, 610C connected to the interposer. The interposer 612 may be implemented in the same or similar manner as the interposers 308, 408.

Each of the dies 606, 610 may include one or more computing system components, such as one or more processor units (e.g., system-on-a-chip (SoC), processor core, graphics processor unit (GPU), accelerator, chipset processor), I/O controller, memory, or network interface controller. In some embodiments, the dies can include one or more additional active or passive devices such as capacitors, decoupling capacitors, resistors, inductors, fuses, diodes, transformers, sensors, electrostatic discharge (ESD) devices, and memory devices. In addition to comprising one or more processor units, the dies can include additional components, such as embedded DRAM, stacked high bandwidth memory (HBM), shared cache memories, input/output (I/O) controllers, or memory controllers. In certain instances, the dies may be referred to as "chiplets", and each die may implement a separate function, e.g., one die implements processor circuitry while another implements memory circuitry.

The other components of the system 600 may be implemented similarly to the examples described above. For instance, the main circuit board 601 may be implemented in the same or similar manner as the main circuit boards 101, 202, 301, or 401, and the package substrate 602 may be implemented in the same or similar manner as the package substrate 102, 202, 302, or 402. In the example shown, the embedded die 606 is a separately fabricated component that is placed within a cavity of the first layer 604, which may be formed of glass or silicon in certain embodiments. The material of the second layer 608, in which the dies 610 and interposer 612 are located, may be a mold material similar to the layers 110, 210, 310, or 410. In the example shown, the die 610A and interposer 612 are connected to the embedded die 606 through a hybrid bonding technique; however, in other embodiments, the connections between the embedded die 606 and the die 610A/interposer 612 may be through traditional solder bonding techniques.

Figure 7:
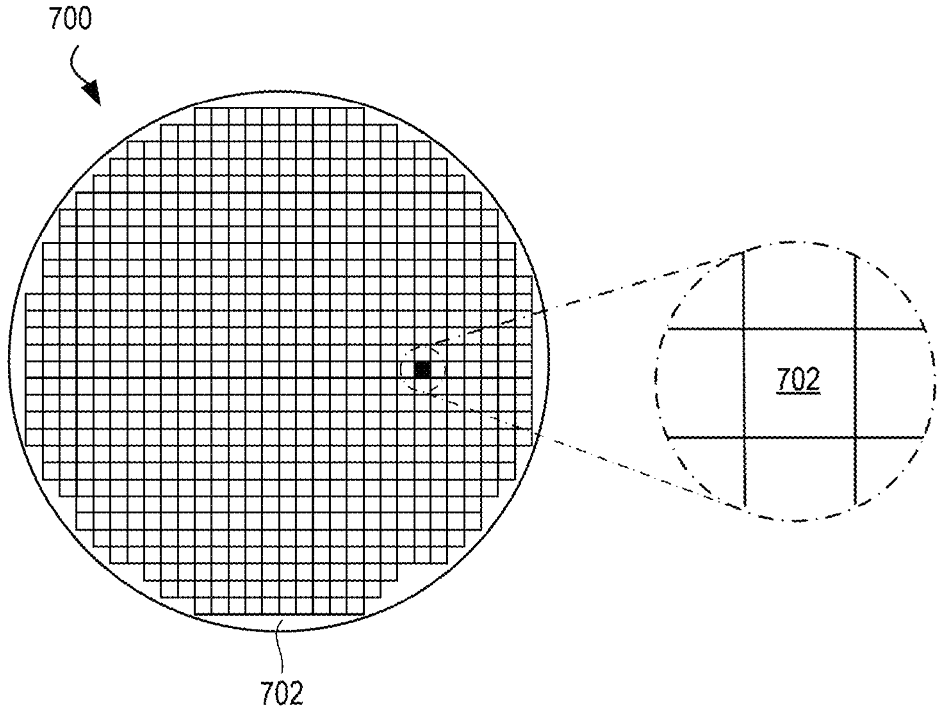
FIG. 7 is a top view of a wafer and dies that may be included in a microelectronic assembly, in accordance with any of the embodiments disclosed herein.

FIG. 7 is a top view of a wafer 700 and dies 702 that may be implemented in or along with any of the embodiments disclosed herein. The wafer 700 may be composed of semiconductor material and may include one or more dies 702 having integrated circuit structures formed on a surface of the wafer 700. The individual dies 702 may be a repeating unit of an integrated circuit product that includes any suitable integrated circuit. After the fabrication of the semiconductor product is complete, the wafer 700 may undergo a singulation process in which the dies 702 are separated from one another to provide discrete "chips" of the integrated circuit product. The die 702 may include one or more transistors (e.g., some of the transistors 840 of FIG. 8, discussed below), supporting circuitry to route electrical signals to the transistors, passive components (e.g., signal traces, resistors, capacitors, or inductors), and/or any other integrated circuit components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processor unit (e.g., the processor unit 1002 of FIG. 10) or other logic that is configured to store information in the memory devices or execute instructions stored in the memory array.

Figure 8:
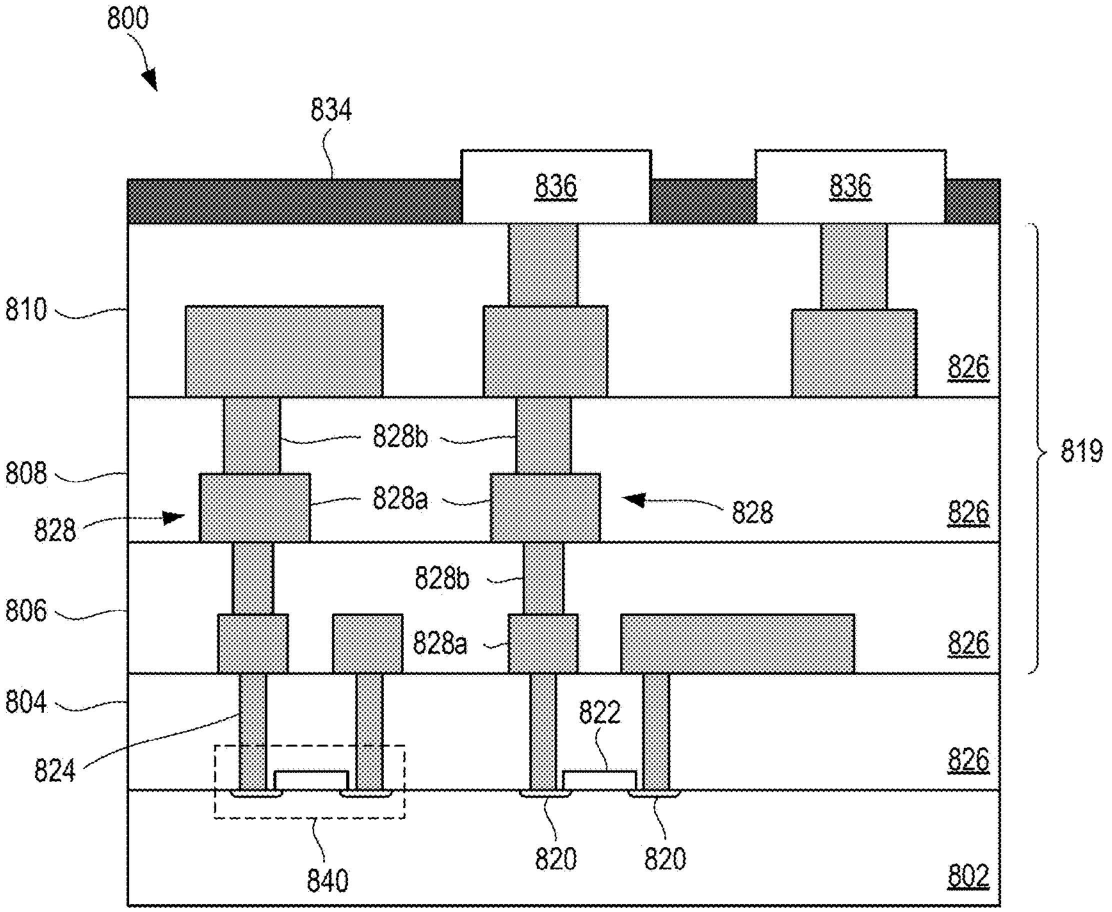
FIG. 8 is a cross-sectional side view of an integrated circuit device that may be included in a microelectronic assembly, in accordance with any of the embodiments disclosed herein.

FIG. 8 is a cross-sectional side view of an integrated circuit device 800 that may be included in any of the embodiments disclosed herein. One or more of the integrated circuit devices 800 may be included in one or more dies 702 (FIG. 7). The integrated circuit device 800 may be formed on a die substrate 802 (e.g., the wafer 700 of FIG. 7) and may be included in a die (e.g., the die 702 of FIG. 7). The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit device 800 may be used. The die substrate 802 may be part of a singulated die (e.g., the dies 702 of FIG. 7) or a wafer (e.g., the wafer 700 of FIG. 7).

The integrated circuit device 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 8, a transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit device 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuit devices having more or fewer interconnect layers than depicted.

In some embodiments, the interconnect structures 828 may include lines 828*a* and/or vias 828*b* filled with an electrically conductive material such as a metal. The lines 828*a* may be arranged to route electrical signals in a direction of a plane that is substantially parallel with a surface of the die substrate 802 upon which the device layer 804 is formed. For example, the lines 828*a* may route electrical signals in a direction in and out of the page and/or in a direction across the page from the perspective of FIG. 8. The vias 828*b* may be arranged to route electrical signals in a direction of a plane that is substantially perpendicular to the surface of the die substrate 802 upon which the device layer 804 is formed. In some embodiments, the vias 828*b* may electrically couple lines 828*a* of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828*a* and/or vias 828*b*, as shown. The lines 828*a* of the first interconnect layer 806 may be coupled with contacts (e.g., the S/D contacts 824) of the device layer 804. The vias 828*b* of the first interconnect layer 806 may be coupled with the lines 828*a* of a second interconnect layer 808.

The second interconnect layer 808 (referred to as Metal 2 or "M2") may be formed directly on the first interconnect layer 806. In some embodiments, the second interconnect layer 808 may include via 828*b* to couple the lines 828 of the second interconnect layer 808 with the lines 828*a* of a third interconnect layer 810. Although the lines 828*a* and the vias 828*b* are structurally delineated with a line within individual interconnect layers for the sake of clarity, the lines 828*a* and the vias 828*b* may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit device 800 (i.e., farther away from the device layer 804) may be thicker that the interconnect layers that are lower in the metallization stack 819, with lines 828*a* and vias 828*b* in the higher interconnect layers being thicker than those in the lower interconnect layers.

The integrated circuit device 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit device 800 with another component (e.g., a printed circuit board or a package substrate, e.g., 112). The integrated circuit device 800 may include additional or alternate structures to route the electrical signals from the interconnect layers 806-810; for example, the conductive contacts 836 may include other analogous features (e.g., posts) that route the electrical signals to external components.

In some embodiments in which the integrated circuit device 800 is a double-sided die, the integrated circuit device 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit device 800 from the conductive contacts 836.

In other embodiments in which the integrated circuit device 800 is a double-sided die, the integrated circuit device 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit device 800 from the conductive contacts 836. In some embodiments, TSVs extending through the substrate can be used for routing power and ground signals from conductive contacts on the opposite side of the integrated circuit device 800 from the conductive contacts 836 to the transistors 840 and any other components integrated into the die 800, and the metallization stack 819 can be used to route I/O signals from the conductive contacts 836 to transistors 840 and any other components integrated into the die 800.

Multiple integrated circuit devices 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
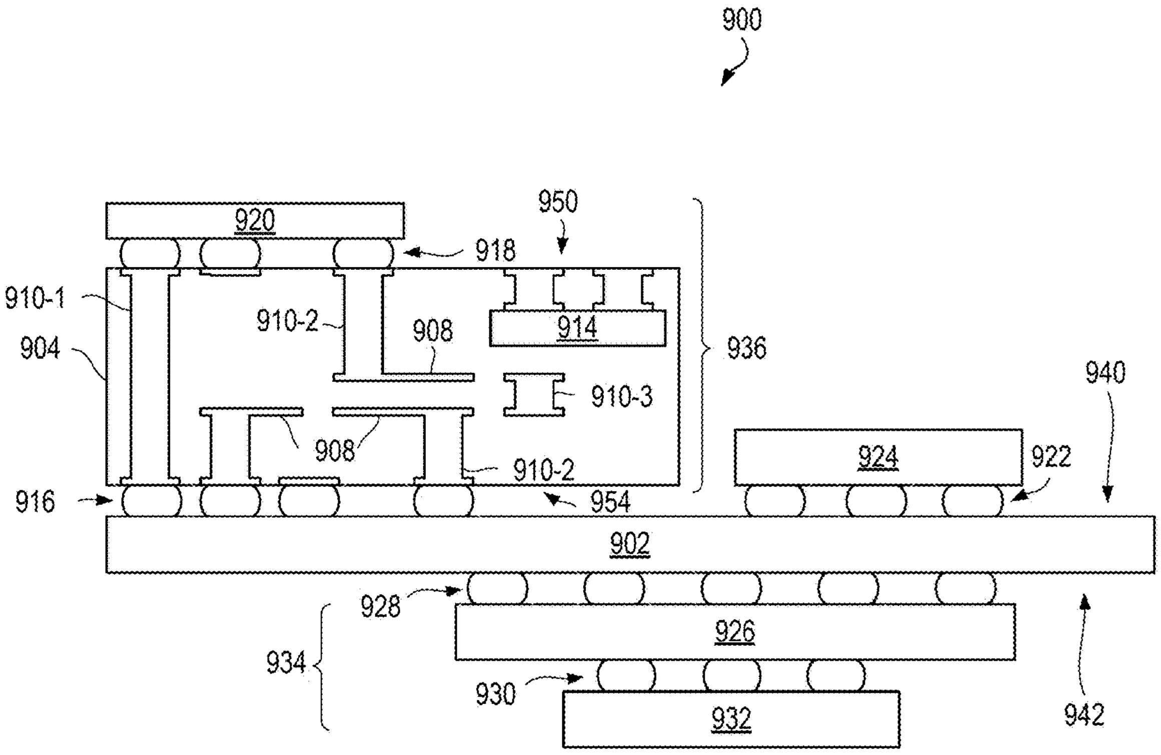
FIG. 9 is a cross-sectional side view of an integrated circuit device assembly that may include embodiments disclosed herein.

FIG. 9 is a cross-sectional side view of an integrated circuit device assembly 900 that may include any of the embodiments disclosed herein. The integrated circuit device assembly 900 includes a number of components disposed on a circuit board 902 (which may be a motherboard, system board, mainboard, etc.). The integrated circuit device assembly 900 includes components disposed on a first face 940 of the circuit board 902 and an opposing second face 942 of the circuit board 902; generally, components may be disposed on one or both faces 940 and 942.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The integrated circuit device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 702 of FIG. 7, the integrated circuit device 800 of FIG. 8) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The integrated circuit device assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit device assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
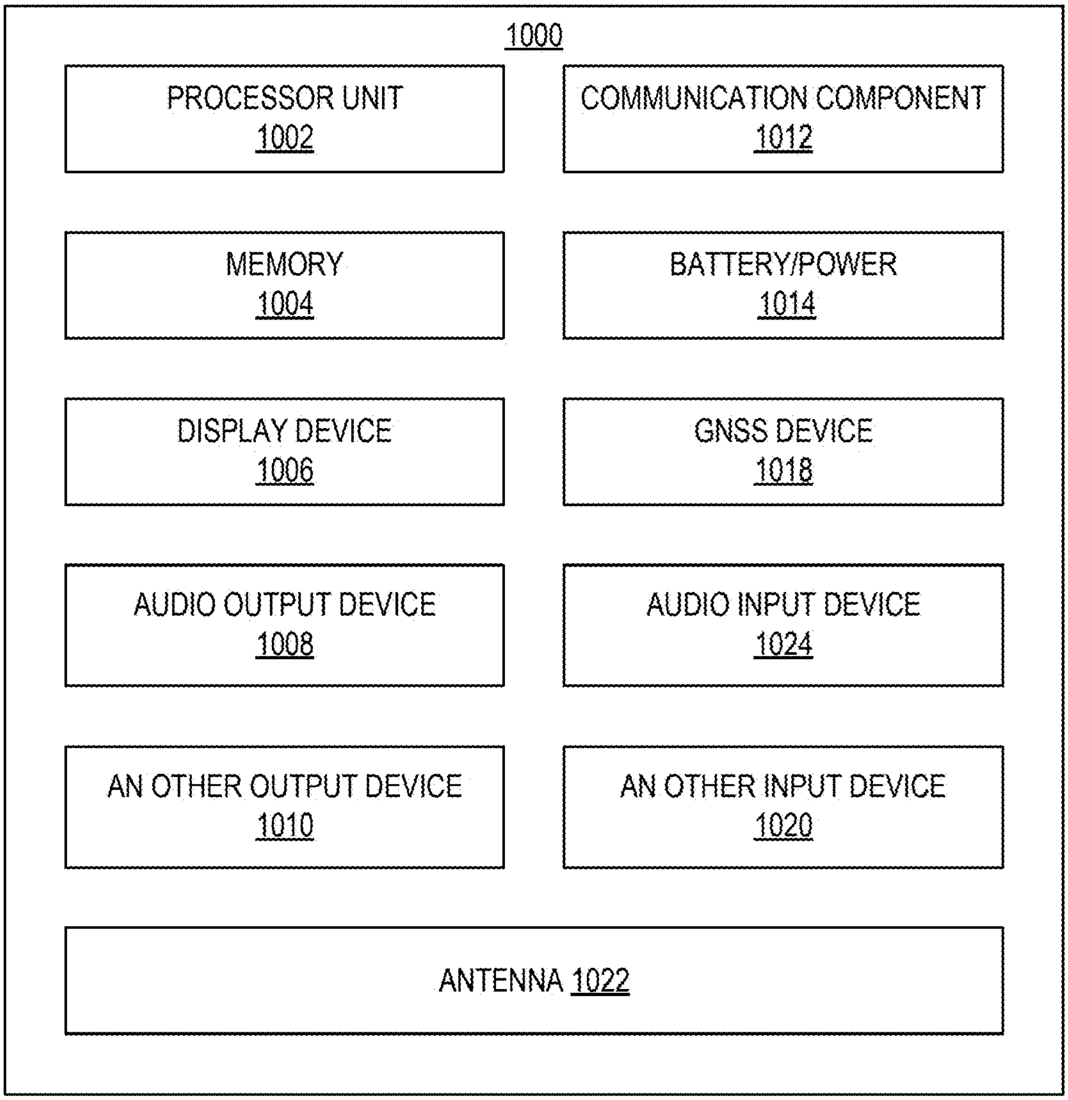
FIG. 10 is a block diagram of an example electrical device that may include a microelectronic assembly, in accordance with any of the embodiments disclosed herein.

FIG. 10 is a block diagram of an example electrical device 1000 that may include one or more of the embodiments disclosed herein. For example, any suitable ones of the components of the electrical device 1000 may include one or more of assemblies 100, integrated circuit devices 800, or integrated circuit dies 702 disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards mainboards, or system boards. In some embodiments, one or more of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1000 can comprise one or more processor units 1002 that are heterogeneous or asymmetric to another processor unit 1002 in the electrical device 1000. There can be a variety of differences between the processing units 1002 in a system in terms of a spectrum of metrics of merit including architectural, microarchitectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is an integrated circuit device comprising: a package substrate; and an integrated circuit device coupled to the package substrate, the integrated circuit device comprising: a first layer comprising input/output (IO) hub circuitry to interconnect a plurality of integrated circuit dies, the IO hub circuitry electrically connected to the package substrate; and a second layer on the first layer, the second layer comprising a plurality of integrated circuit dies electrically connected to the IO hub circuitry.

Example 2 includes the subject matter of Example 1, wherein the first layer comprises glass.

Example 3 includes the subject matter of Example 1 or 2, wherein the first layer comprises conductive pillars electrically coupling a top side of the first layer to the package substrate, at least one of the integrated circuit dies electrically connected to the conductive pillars.

Example 4 includes the subject matter of any one of Examples 1-3, comprising a die embedded in a cavity of the first layer, wherein the IO hub circuitry is in the die embedded in the cavity of the first layer.

Example 5 includes the subject matter of any one of Examples 1-4, wherein at least one integrated circuit die is directly connected to the IO hub circuitry.

Example 6 includes the subject matter of any one of Examples 1-4, wherein the at least one integrated circuit die is connected to the IO hub circuitry through solder bonds.

Example 7 includes the subject matter of any one of Examples 1-6, wherein at least two of the integrated circuit dies are electrically connected to the IO hub circuitry through an interposer, the interposer comprising circuitry to interconnect the at least two integrated circuit dies.

Example 8 includes the subject matter of Example 7, wherein the interposer is directly connected to the IO hub circuitry.

Example 9 includes the subject matter of Example 7, wherein the interposer is connected to the IO hub circuitry through solder bonds.

Example 10 includes the subject matter of any one of Examples 1-9, wherein the second layer comprises a mold material around the plurality of integrated circuit dies.

Example 11 includes the subject matter of any one of Examples 1-10, wherein the IO hub circuitry is electrically connected to the package substrate through solder bonds.

Example 12 is a system comprising: a main circuit board; and an integrated circuit package coupled to the main circuit board, the integrated circuit package comprising: a package substrate; and an integrated circuit device connected to the package substrate, the integrated circuit device comprising: a first integrated circuit die embedded in a first layer, the first integrated circuit die electrically connected to the package substrate; and a plurality of second integrated circuit dies in a second layer, the second integrated circuit dies electrically connected to the first integrated circuit die.

Example 13 includes the subject matter of Example 12, wherein the first integrated circuit die comprises input/output (IO) hub circuitry.

Example 14 includes the subject matter of Example 12 or 13, wherein the first layer comprises glass.

Example 15 includes the subject matter of any one of Examples 12-14, wherein at least one of the second integrated circuit dies is directly connected to the first integrated circuit die.

Example 16 includes the subject matter of any one of Examples 12-14, wherein at least one of the second integrated circuit dies is connected to the first integrated circuit die through a solder bond.

Example 17 includes the subject matter of any one of Examples 12-16, wherein at least two second integrated circuit dies are connected to the first integrated circuit die through an interposer, the interposer comprising circuitry to interconnect the at least two second integrated circuit dies.

Example 18 includes the subject matter of Example 17, wherein the interposer is directly connected to the first integrated circuit die.

Example 19 includes the subject matter of Example 17, wherein the interposer is connected to the first integrated circuit die through solder bonds.

Example 20 includes the subject matter of any one of Examples 12-19, wherein the second layer comprises a mold material around the second integrated circuit dies and the interposer.

Example 21 includes the subject matter of any one of Examples 12-20, wherein the first integrated circuit die is electrically connected to the package substrate through solder bonds.

Example 22 is a method of manufacturing an integrated circuit package, comprising: forming an integrated circuit chip, comprising: embedding a first integrated circuit die within a cavity of a glass layer; attaching a plurality of second integrated circuit dies to a top side of the first integrated circuit die; and depositing a mold material around the plurality of second integrated circuit dies; and coupling the integrated circuit chip to a package substrate.

Example 23 includes the subject matter of Example 22, wherein attaching the plurality of second integrated circuit dies to a top side of the first integrated circuit die comprises coupling the second integrated circuit dies to the first integrated circuit die using a hybrid bonding technique.

Example 24 includes the subject matter of Example 23, wherein the hybrid bonding technique is a polyimide-based hybrid bonding technique.

Example 25 includes the subject matter of Example 23, wherein the hybrid bonding technique is a silicon oxide-based hybrid bonding technique.

Example 26 includes the subject matter of Example 22, wherein attaching the plurality of second integrated circuit dies to a top side of the first integrated circuit die comprises coupling the second integrated circuit dies to the first integrated circuit die using a solder bonding technique.

Example 27 includes the subject matter of any one of Examples 22-26, wherein coupling the integrated circuit chip to the package substrate comprises forming solder bumps on bonding pads on a bottom side of the integrated circuit chip.

Example 28 is an integrated circuit device manufactured according to the method of any one of Examples 22-27.

In the above description, various aspects of the illustrative implementations have been described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations have been set forth to provide a thorough understanding of the illustrative implementations. However, it will be apparent to one skilled in the art that the present disclosure may be practiced without all of the specific details. In other instances, well-known features have been omitted or simplified in order not to obscure the illustrative implementations.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The above description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

In various embodiments, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

In various embodiments, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The invention claimed is:

1. An integrated circuit device comprising:

a package substrate; and an integrated circuit device coupled to the package substrate, the integrated circuit device comprising:

a first layer comprising glass and an input/output (IO) hub circuitry die embedded in a cavity of the glass, the IO hub circuitry die to interconnect a plurality of integrated circuit dies, the IO hub circuitry die electrically connected to the package substrate; and a second layer on the first layer, the second layer comprising a plurality of integrated circuit dies, wherein at least two of the integrated circuit dies are electrically connected to the IO hub circuitry die through an interposer in the second layer, the interposer comprising circuitry to interconnect the at least two integrated circuit dies.

2. The integrated circuit device of claim 1, wherein the first layer comprises conductive pillars electrically coupling a top side of the first layer to the package substrate, at least one of the integrated circuit dies electrically connected to the conductive pillars.

3. The integrated circuit device of claim 1, wherein at least one integrated circuit die is directly connected to the IO hub circuitry die.

4. The integrated circuit device of claim 1, wherein at least one integrated circuit die is connected to the IO hub circuitry die through solder bonds.

5. The integrated circuit device of claim 1, wherein the interposer is directly connected to the IO hub circuitry die.

6. The integrated circuit device of claim 1, wherein the interposer is connected to the IO hub circuitry die through solder bonds.

7. The integrated circuit device of claim 1, wherein the second layer comprises a mold material around the plurality of integrated circuit dies.

8. The integrated circuit device of claim 1, wherein the first layer comprises a mold material around the IO hub circuitry die.

9. A system comprising:

a main circuit board; and an integrated circuit package coupled to the main circuit board, the integrated circuit package comprising:

a package substrate; and an integrated circuit device connected to the package substrate, the integrated circuit device comprising:

a first integrated circuit die embedded in a first layer comprising glass, the first integrated circuit die electrically connected to the package substrate; and a plurality of second integrated circuit dies in a second layer, the second integrated circuit dies electrically connected to the first integrated circuit die, wherein at least two second integrated circuit dies are connected to the first integrated circuit die through an interposer, the interposer comprising circuitry to interconnect the at least two second integrated circuit dies.

10. The system of claim 9, wherein the first integrated circuit die comprises input/output (IO) hub circuitry.

11. The system of claim 9, wherein at least one of the second integrated circuit dies is directly connected to the first integrated circuit die.

12. The system of claim 9, wherein at least one of the second integrated circuit dies is connected to the first integrated circuit die through a solder bond.

13. The system of claim 9, wherein the interposer is directly connected to the first integrated circuit die.

14. The system of claim 9, wherein the interposer is connected to the first integrated circuit die through solder bonds.

15. The system of claim 9, wherein the second layer comprises a mold material around the second integrated circuit dies.

16. The system of claim 9, wherein the first integrated circuit die is electrically connected to the package substrate through solder bonds.

17. A method of manufacturing an integrated circuit package, comprising:

forming an integrated circuit chip, comprising:

embedding a first integrated circuit die within a cavity of a glass layer;

attaching an assembly comprising a plurality of second integrated circuit dies and an interposer to a top side of the glass layer, wherein attaching the assembly directly couples the interposer to the first integrated circuit die; and depositing a mold material around the assembly; and coupling the integrated circuit chip to a package substrate.

18. The method of claim 17, wherein attaching the assembly comprises coupling the interposer to the first integrated circuit die using a hybrid bonding technique.

19. The method of claim 18, wherein the hybrid bonding technique is a polyimide-based hybrid bonding technique.

20. The method of claim 18, wherein the hybrid bonding technique is a silicon oxide-based hybrid bonding technique.

* * * * *